United States Patent [19]
Lin et al.

[11] Patent Number: 5,962,193
[45] Date of Patent: Oct. 5, 1999

[54] METHOD AND APPARATUS FOR CONTROLLING AIR FLOW IN A LIQUID COATER

[75] Inventors: Kuang-Hung Lin; Dong-Hsu Cheng, both of Hsin Chu; Cheng-Wei Huang, Miaoli; Cheng-Ku Chen, Hsin-Chiu, all of Taiwan

[73] Assignee: Taiwan Semiconductor Manufacturing Co. Ltd., Hsin-Chu, Taiwan

[21] Appl. No.: 09/006,262

[22] Filed: Jan. 13, 1998

[51] Int. Cl.⁶ .................... H01L 21/027; B05C 11/08; G03F 7/16
[52] U.S. Cl. .................... 430/311; 430/935; 427/240; 427/385.5; 118/52
[58] Field of Search .................... 430/311, 327, 430/935; 427/240, 385.5; 118/52

[56] References Cited

U.S. PATENT DOCUMENTS

| | | | |
|---|---|---|---|
| 4,800,836 | 1/1989 | Yamamato et al. | 118/52 |
| 5,395,649 | 3/1995 | Ikeda | 427/240 |

FOREIGN PATENT DOCUMENTS

| | | |
|---|---|---|
| 58-174267 | 10/1983 | Japan . |
| 60-245225 | 12/1985 | Japan . |
| 2-144169 | 6/1990 | Japan . |
| 5-006855 | 1/1993 | Japan . |

*Primary Examiner*—John A. McPherson
*Attorney, Agent, or Firm*—Tung & Associates

[57] ABSTRACT

The present invention discloses a method and apparatus for controlling air flow in a liquid coating apparatus by providing an adjustable housing that consists of an upper compartment and a lower compartment such that the height of the cavity contained therein can be adjusted. Subsequently, the spacing between a substrate to be coated and the interior wall of the upper compartment can be suitably adjusted to allow a desirable quantity of air flowing therethrough. The redeposition of liquid coating particles thrown off the substrate surface during a spin coating process and then bouncing back from the interior wall of the upper compartment onto the substrate surface can be prevented. The contamination of the substrate surface can therefore be eliminated or reduced. The present invention adjusting means may further include a removable roof member which can be turned by thread means to adjust the spacing between the bottom surface of the roof member and the substrate resulting in an adjustable air flow rate through such spacing.

20 Claims, 2 Drawing Sheets

METHOD AND APPARATUS FOR CONTROLLING AIR FLOW IN A LIQUID COATER

FIELD OF THE INVENTION

The invention generally relates to a method and apparatus for controlling air flow in a liquid coating apparatus and more particularly, relates to a method and apparatus for controlling air flow in a photoresist coating machine wherein the apparatus is equipped with adjusting means capable of adjusting the distance between an interior wall of the upper compartment of the machine and the specimen positioned on a rotating platform such that contaminating particles that fall on the specimen surface by bouncing off the interior wall of the compartment can be greatly reduced.

BACKGROUND OF THE INVENTION

In the manufacturing process for integrated circuit devices, the lithography process is frequently used for reproducing circuits and other structures on a semiconductor substrate. As the first step in a lithography process, a photoresist layer must first be coated onto a semiconductor substrate such that an image may be projected and developed on the substrate. The photoresist material is most likely a liquid that must be coated in a very thin layer on top of the semiconductor substrate. In a conventional process for applying a photoresist coating material to a semiconductor substrate, a photoresist coating machine is used. The coating machine generally consists of a sealed chamber constructed by an upper compartment and a lower compartment and a circular shaped, rotating platform having a diameter that is slightly less than the diameter of a semiconductor substrate. The rotating platform is sometimes called a vacuum chuck since vacuum is applied to the platform for holding the semiconductor substrate securely during a spin coating process. The rotating platform is positioned in the coating machine in such a way that a semiconductor substrate may be placed on top in a horizontal plane. During a coating process, the bottom or the uncoated surface of a semiconductor substrate is placed onto the rotating platform. A suitable vacuum pressure is then applied to supply a suction force to the bottom surface of the substrate such that it stays securely on the vacuum chuck even at high rotational speed. The rotating motion of the vacuum chuck is achieved by an axle which is connected to and extended downwardly from the vacuum chuck such that it may be powered by an electric motor to achieve the rotational motion of the chuck.

In a typical photoresist coating process, a desirable amount of a liquid photoresist material is first applied to a top, upwardly-facing surface of the semiconductor substrate by a liquid dispenser that is mounted on a track system while the substrate is being rotated at a low speed on the vacuum chuck. The photoresist liquid spread radially outward from the center of the semiconductor substrate where it is applied towards the edge of the semiconductor substrate until the entire top surface of the substrate is covered with a thin layer. Excess photoresist liquid spun off the rotating wafer during the photoresist application process. The rotational speed of the vacuum chuck and the amount of the photoresist liquid applied at the center of the semiconductor substrate can be suitably determined and adjusted prior to and during an application process such that a predetermined, desirable thickness of the photoresist is obtained. The rotational speed of the vacuum chuck is normally increased to a higher speed at the end of the application process to ensure that the entire surface of the substrate is evenly coated with the photoresist material.

A conventional apparatus for coating photoresist on a semiconductor substrate is shown in FIGS. 1A and 1B. The apparatus 10 shown in FIG. 1A consists of an upper compartment 12 and a lower compartment 14. The compartments are generally of a cylindrical shape such that when put together, a round cylindrical shaped cavity is provided inside the two compartments. A top ring, or roof member 18 is provided in the upper compartment 12 by compression fit. A rotating platform 20, or a vacuum chuck, is positioned at the center of the cavity 22 for supporting a semiconductor substrate 26 on a top surface 24 of the vacuum chuck 20. The vacuum chuck can be rotated by an axle 32 which is connected to an electric motor (not shown) for providing rotational motion. The lower compartment 14 is provided with a spent photoresist drain pipe 34 and an exhaust pipe 36. The spent photoresist drain pipe 34 is used to drain away photoresist liquid that spun off the substrate during a coating operation. The exhaust pipe 36 is used to exhaust the air flow generated by the rotating vacuum chuck to prevent a pressure build up in the cavity 22 of the chamber. It should be noted that, in the conventional photoresist coater, the upper compartment 12 and the lower compartment 14 are assembled together in a fixed position such that the height of the cavity 22 between the upper compartment 12 and the lower compartment 14 is fixed and cannot be adjusted. It should also be noted that the top ring 18 is assembled to the upper compartment 12 in a fixed manner such that its relative position to the semiconductor substrate 26 cannot be adjusted. FIG. 1B shows a perspective view of the top ring 18, the upper compartment 12 and the lower compartment 14 in a disassembled view.

In the operation of the conventional coater shown in FIG. 1A, the vacuum chuck 20 with a semiconductor substrate 26 positioned on top is first elevated to a position near the top ring 18. A liquid dispenser (not shown) then approaches the center of the substrate 26 and applies a predetermined amount of the liquid photoresist material to the center of the substrate 26. The vacuum chuck 20 then starts spinning to spread out the photoresist material to evenly cover the top surface of the substrate 26. Extra photoresist material is thrown off the substrate surface and drained away by the drain pipe 34. An air flow generated between the rotating vacuum chuck 20 and the top ring 18 carries contaminating particles in the chamber and the sprayed photoresist powder into the exhaust pipe 36.

When a lithographic process is carried out on a photoresist layer, any foreign particles or defects in the pattern formed on the photoresist layer act as extra etch mask and are reproduced on the substrate surface. Certain types of these extra resist pattern have been identified as originating from the photoresist coating process, i.e., photoresist powder or gel that bounces back onto the substrate surface during the high speed spinning step of the coating process. The extra resist pattern on the substrate surface causes serious defects in the substrate and thus, greatly reduces the yield of the chip fabrication process.

Modern coater designers have noticed the contamination problem by the photoresist powder or gel and a catch-cup assembly (the lower compartment shown in FIG. 1A) has been installed on the coater in an attempt to eliminate the problem. The lower compartment 14 of the coater consists of a photoresist drain pipe 34 and an exhaust pipe 36 wherein the drain pipe is supposed to collect extra photoresist liquid thrown off the substrate, while the exhaust pipe is to collect photoresist powder sprayed into the cavity of the coating apparatus. However, due to the existence of an air flow turbulence in the cavity, the powder sprayed into the cavity fall back onto the substrate, especially when the powder is mixed with vaporized thinner in the air flow. The sprayed powder in the cavity when fell back onto the substrate surface forms a "donut" shaped extra photoresist pattern on the surface of the substrate. In a donut-shaped pattern, the photoresist layer is thicker at the edges of the substrate than at the center thereof Such formation causes quality and reliability problems since the thickness of coating on the substrate surface varies from the target thickness that is supposed to be formed. Such variations from the target thickness of the photoresist layer across the surface of a semiconductor substrate greatly affect critical dimensions during subsequent processing steps for the substrate. For instance, variations in the photoresist layer from the target thickness may greatly affect the linewidth control of a polysilicon layer. This is caused by the thickness variations of the photoresist layer and thus different linewidths are generated during the photolithography steps. The control of the uniformity of the photoresist coating layer is therefore critical for achieving high yield in a semiconductor fabrication process.

It is therefore an object of the present invention to provide a method for controlling a liquid coating process without the drawbacks and shortcomings of the conventional liquid coating methods.

It is another object of the present invention to provide a method for controlling a liquid coating process on a semiconductor substrate that can be utilized in an existing commercial coating apparatus.

It is a further object of the present invention to provide a method for controlling a liquid coating process by adjusting the cavity height inside a liquid coating chamber.

It is another further object of the present invention to provide a method for controlling a coating process in a photoresist coating apparatus by increasing the distance between a substrate to be coated and the interior wall of an upper compartment such that photoresist particles thrown off the substrate are not bounced back from the wall onto the substrate.

It is still another object of the present invention to provide a method for controlling a photoresist coating process in a coating apparatus by providing an upper compartment and a lower compartment which are capable of forming a cavity therein having adjustable height.

It is yet another object of the present invention to provide a method for controlling a photoresist coating process by utilizing an adjustable top ring in the upper compartment of the apparatus such that the distance between the substrate to be coated and the top ring can be adjusted.

It is yet another further object of the present invention to provide a photoresist coating apparatus consisting of an upper compartment and a lower compartment which can be assembled together and adjusted to produce an adjustable height inside the two compartments.

It is still another further object of the present invention to provide a photoresist coating apparatus that is equipped with an adjustable top ring installed in an upper compartment of the apparatus such that an air flow occurring on top of the substrate can be adjusted.

SUMMARY OF THE INVENTION

In accordance with the present invention, a method and apparatus for controlling a liquid coating process or the air flow in a liquid coating apparatus by providing an adjustable housing and an adjustable top ring in the upper compartment of the housing are provided.

In a preferred embodiment, a method for controlling air flow in a liquid coating apparatus can be carried out by the operating steps of first providing a housing for a liquid coating apparatus comprising an upper compartment and a lower compartment defining a cavity contained therein, then providing a rotatable specimen platform for holding a specimen to be coated therein and a liquid dispenser in the cavity, then positioning a specimen on the rotatable platform at a first distance from an interior wall of the upper compartment that is substantially parallel with the specimen, and then providing an adjusting means and adjusting the first distance such that air flow pattern between the specimen and the interior wall of the upper compartment changes accordingly. The adjusting means may include mounting means between the upper compartment and the lower compartment such that a height of the cavity can be adjusted. The mounting means may further include bracket means situated on an interior periphery surface of the lower compartment adapted for supporting the upper compartment wherein the bracket means moves up and down for a displacement of at least 2.54 cm. The adjusting means may further include a removable roof member adapted for engaging an opening in the upper compartment. The engagement method by the removable roof member to the upper compartment may be by thread means. When the removable roof member engages the upper compartment by thread means, a second distance between the specimen and a bottom surface of the roof member can be adjusted.

In another preferred embodiment, the present invention provides a method for reducing contaminants from depositing on a wafer surface in a photoresist coating apparatus which can be carried out by the operating steps of first providing a coating apparatus that has an upper compartment and a lower compartment defining a cavity contained therein. The apparatus further includes at least one adjusting means selected from the group consisting of a bracket means adapted for engaging the upper compartment to the lower compartment defining a first height of the cavity and a removable roof member adapted for engaging an opening in the upper compartment for defining a second height of the cavity, then providing a rotatable vacuum chuck for holding a wafer thereon, then providing a photoresist dispenser for dispensing a predetermined volume of photoresist on a surface of the wafer, and then adjusting the first height of the cavity by the bracket means or adjusting the second height of the cavity by the removable roof means such that a desirable air flow is generated during a photoresist coating process by the rotating vacuum chuck to prevent the deposition of contaminating particles on the wafer surface. The bracket means may include an inner peripheral bracket for mounting to an interior peripheral surface of the lower compartment onto which the upper compartment is seated, the inner peripheral bracket is mounted to the interior peripheral surface by locating pins such that its position relative to the upper compartment can be adjusted. The removable roof means engages the opening in the upper compartment by thread means such that the second height of the cavity can be adjusted by turning the removable roof member. The contaminating particles are normally generated by the photoresist liquid bouncing off the interior wall of the upper compartment. The method may further include the step of rotating the vacuum chuck at a speed of not less than 500 RPM after the predetermined volume of photoresist is dispensed on the wafer surface. The method may further include the step of adjusting the first height of the cavity by the bracket means by not less than ½ inch.

The present invention is further directed to an apparatus for depositing liquid on a rotating article including a coating apparatus which has an upper compartment and a lower compartment defining a cavity contained therein, a rotatable platform for rotating an article positioned on top of the platform, a liquid dispensing means suspended over the platform, and at least one adjusting means selected from the group consisting of a bracket means adapted for engaging the upper compartment to the lower compartment defining a first height of the cavity and a removable roof member adapted for engaging an opening in the upper compartment defining a second height of the cavity. The apparatus may be suitably a photoresist coater for a semiconductor wafer wherein the rotatable platform for holding an article on top is a vacuum chuck. The cavity formed by the upper compartment and the lower compartment is generally of a cylindrical shape. The lower compartment for the coating apparatus may further include a spent liquid drain pipe and an exhaust pipe. The bracket means includes a toroidal shaped bracket attached to an inner peripheral surface of the lower compartment by pins. The removable roof member may include a generally circular roof member threadingly engaging the opening in the upper compartment.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention provides a method and apparatus for controlling air flow in a liquid coating apparatus that incorporate the use of an adjustable bracket means for adjusting the height of a cavity in the coating apparatus and a removable roof member for adjusting the air space between a substrate to be coated and the interior wall of the upper compartment such that excess liquid particles thrown off the substrate is less likely to bounce off the interior wall of the upper compartment and fall back onto the surface of the substrate causing contamination problems.

Figure 1A:
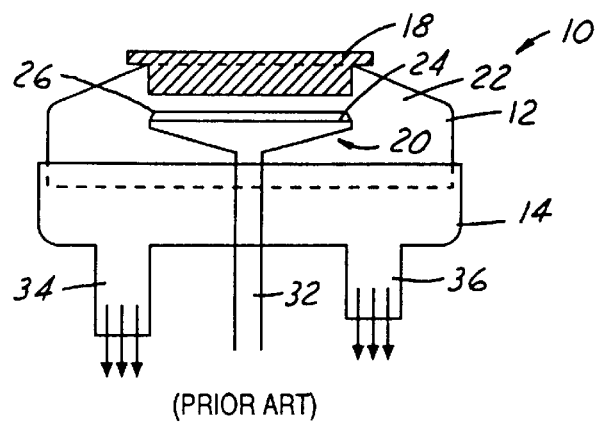
FIG. 1A is a cross-sectional view of a conventional liquid coating apparatus.
Figure 1B:
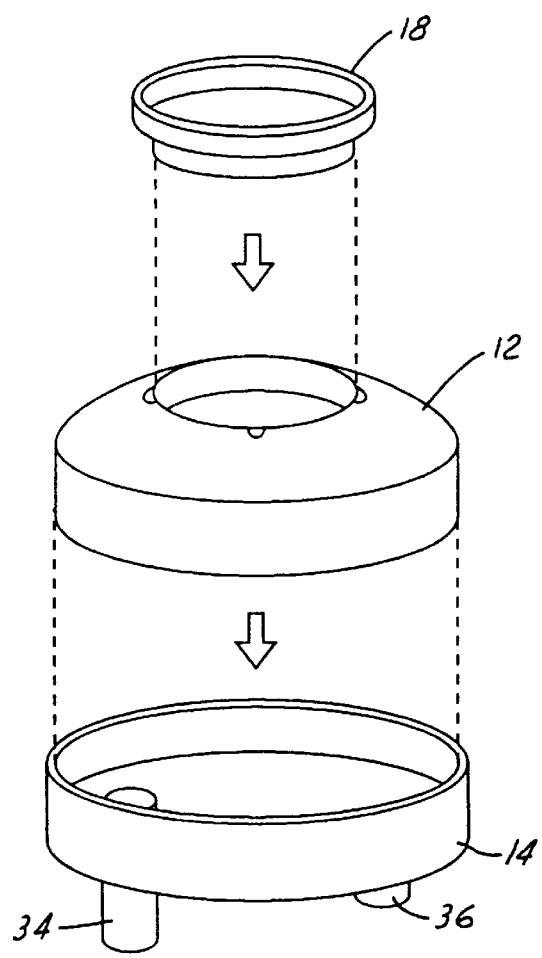
FIG. 1B is a perspective view of the removable roof member, the upper compartment and the lower compartment of FIG. 1A.
Figure 2A:
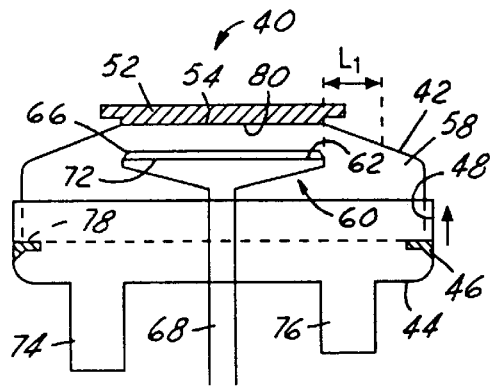
FIG. 2A is a cross-sectional view of the present invention coating apparatus including an adjustable bracket means with the upper compartment fixed in a lower position.

Referring initially to FIG. 2A, wherein a cross-sectional view of a present invention coating apparatus 40 is shown. The coating apparatus is constructed by an upper compartment 42, a lower compartment 44 and a bracket means 46 mounted to an interior wall 48 of the lower compartment 44. The coating apparatus 40 further includes a top ring, or a roof member 52 for partially closing the top opening 54 of the upper compartment 42. The roof member 52 is normally compression mounted to the opening 54. The coating apparatus further includes a vacuum chuck 60 which has a top surface 62, a substrate 66 mounted on the top surface 62 and an axle 68 for rotating the vacuum chuck 60. The vacuum chuck 60 is further equipped with vacuum passage means (not shown) such that a negative pressure may be applied to the backing 72 of the substrate 66 to securely mount the substrate on the chuck during a spin coating process. The axle 68 is coupled to a motor means (not shown) such that rotational motion of the vacuum chuck 60 is possible. The lower compartment 44 is equipped with a spent liquid drain pipe 74 and an exhaust pipe 76. The spent liquid drain pipe 74 is used to collect and drain away the spent liquid that is spun off the surface of the substrate 66 during a spin coating process. The exhaust pipe 66 is used to vent the air flow generated in the cavity 58 during a spin coating process.

Figure 3A:
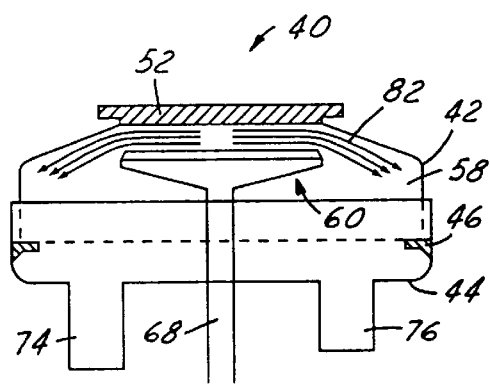
FIG. 3A is a cross-sectional view of the present invention coating apparatus with the upper compartment fixed in a lower position showing the air flow between a substrate and a roof member.

It should be noted that the bracket means 46 can be advantageously adjusted upwardly or downwardly. As shown in FIG. 2A, the bracket means is adjusted to a lower position such that the lower edge 78 of the upper compartment rests on the bracket means 46 at the lowest position such that the height in the cavity 58 between the upper compartment 42 and the lower compartment 44 is at a minimum value. When the bracket means 46 is at the lowest position, as shown in FIG. 2A, the distance between the substrate 66 and the bottom surface 80 of the roof member 52 is at a minimum. An air flow pattern 82 is shown in FIG. 3A when the spacing between the substrate 66 and the roof member 52 is at a minimum. The air flow pattern 82 has a higher air flow rate according to the Bernoulli equation:

$$\frac{P}{\rho} + gZ + \frac{v^2}{2} = \text{constant}$$

Wherein P is the fluid pressure, v is the fluid velocity, p is the mass density of the fluid, g is the acceleration due to gravity, and Z is the vertical height. The quantity of the above equation is constant along any streamline of static flow. From the Bernoulli equation, it is seen that as Z becomes smaller, as shown in FIG. 3A, the velocity of the air flow v becomes larger. The larger air flow rate between the substrate 66 and the roof member 52 may help to prevent the deposition of any photoresist particles thrown of the substrate and bounced back by the upper compartment 42 to fall back onto the substrate surface.

Figure 2B:
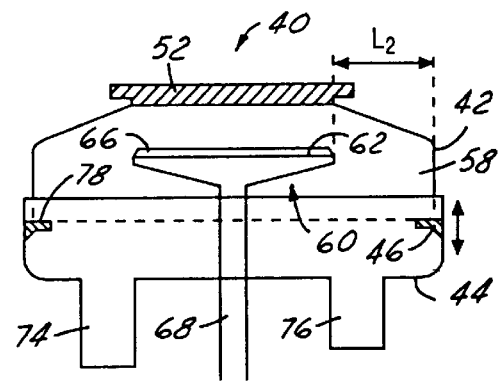
FIG. 2B is a cross-sectional view of the present invention coating apparatus with the adjustable bracket means and the upper compartment fixed in a higher position.
Figure 3B:
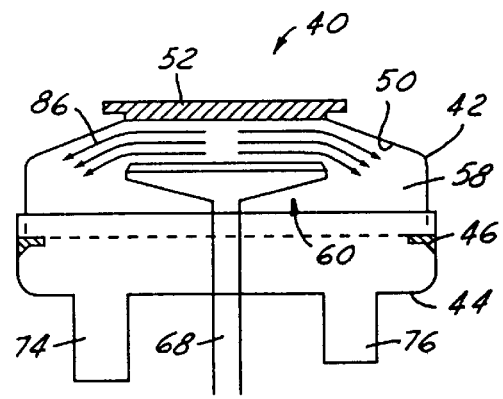
FIG. 3B is a cross-sectional view of the present invention coating apparatus with the upper compartment in a higher position illustrating the air flow pattern between the substrate and the roof member.

Referring now to FIG. 2B, where it is shown the present invention coating apparatus 40 with the bracket member 46 adjusted to the highest position such that the upper compartment 42 is moved further away from the lower compartment 44 producing a maximum height of the cavity 58. At the maximum height, the spacing between the substrate 66 and the roof member 52 is at a maximum and thus, as shown in FIG. 3B, the air flow rate 86 becomes smaller. However, it should be noted that while air flow rate is one determining factor in preventing waste particles from depositing back onto the surface of the substrate, the distance between the edge of the substrate and the upper compartment wall is also an important factor. For instance, the distance $L_1$ in FIG. 2A is substantially smaller than the distance of $L_2$ shown in FIG. 2B. This presents another important element in the present invention method in that, the longer distance, i.e., $L_2$ deters the photoresist particles bouncing back from the interior wall of the upper compartment from falling back onto the substrate surface. Generally, the higher position of the upper compartment, as shown in FIG. 2B, is more effective in preventing excess photoresist particles from bouncing back onto the surface of the substrate. This may occur even though the air flow rate 86 is smaller than the air flow rate 82.

Figure 4A:
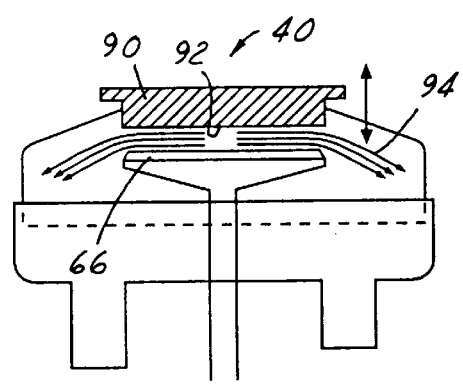
FIG. 4A is a cross-sectional view of the present invention coating apparatus incorporating a removable roof member that is fixed in a lower position illustrating the air flow pattern over the substrate.
Figure 4B:
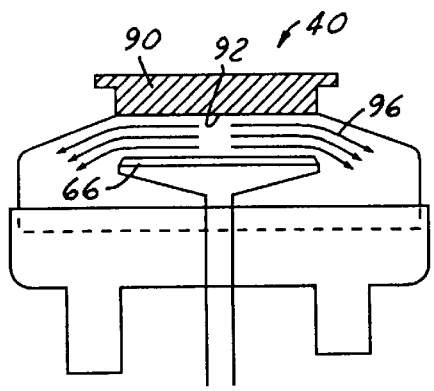
FIG. 4B is a cross-sectional view of the present invention coating apparatus with a removable roof member fixed at a higher position illustrating the air flow pattern over the substrate.

A second adjusting means of the present invention novel apparatus is shown in FIGS. 4A and 4B. A removable roof member 90 is utilized in the present invention coating apparatus 40. It should be noted that the bracket means, while not shown in FIGS. 4A and 4B, can be used in conjunction with the removable roof member 90 to further enhance the adjustability of the air flow rates. As shown in FIG. 4A, the removable roof member 90 is turned to a lowest position by a thread means (not shown) such that the spacing between the bottom surface 92 of the roof member 90 and the substrate 66 is at a minimum. At such minimum spacing, the air flow rate 94 is at a higher value than the air flow rate 96 shown in FIG. 4B, based on the Bernoulli equation. FIG. 4B shows that the removable roof member 90 is adjusted to the highest position such that the spacing between the bottom surface 92 of the roof member 90 and the substrate 66 is at a maximum. At such maximum spacing, the air flow rate 96 is reduced as shown by the shorter flow lines. It should be noted that, in this embodiment, while the spacing between the removable roof member and the substrate can be adjusted, the distance between the substrate and the interior wall 50 of the upper compartment 42 can not be adjusted. It is therefore advantageous to use a combination adjusting means of the removable roof member together with the bracket means such that the height of the cavity between the upper compartment and the lower compartment may also be adjusted to realize the full benefit of the present invention novel method. It has been noted that a full displacement of at least 2.54 cm is desirable for the bracket means to move up and down for adjusting the position of the upper compartment. The bracket means may be advantageously a toroidal shaped bracket attached to an inner peripheral surface of the lower compartment by pins.

The present invention novel apparatus and method have therefore been amply demonstrated by the above descriptions and the appended drawings of FIGS. 2A–4B. It should be noted that while a photoresist coating process is used to illustrate the effectiveness of the present invention method, any other coating process that involves a liquid coating material may be suitably used on any substrates that may not be a semiconductor wafer.

While the present invention has been described in an illustrative manner, it should be understood that the terminology used is intended to be in a nature of words of description rather than of limitation.

Furthermore, while the present invention has been described in terms of a preferred and alternate embodiments, it is to be appreciated that those skilled in the art will readily apply these teachings to other possible variations of the inventions.

The embodiment of the invention in which an exclusive property or privilege is claimed are defined as follows:

1. A method for controlling air flow in a liquid coating machine comprising the steps of:

providing a housing for a liquid coating machine comprising an upper compartment and a lower compartment defining a cavity contained therein, providing a rotatable specimen platform for holding a specimen to be coated therein and a liquid dispenser in said cavity, positioning a specimen on said rotatable platform at a first distance from an interior wall of said upper compartment that is substantially parallel with said specimen, and providing an adjusting means and adjusting said first distance such that air flow pattern between said specimen and said interior wall of said upper compartment changes accordingly.

2. A method for controlling air flow in a liquid coating machine according to claim 1, wherein said adjusting means comprises mounting means between said upper compartment and said lower compartment such that a height of said cavity can be adjusted.

3. A method for controlling air flow in a liquid coating machine according to claim 2, wherein said mounting means comprises bracket means situated on an interior periphery surface of said lower compartment adapted for supporting said upper compartment, said bracket means moves up and down for a displacement of at least 2.54 cm.

4. A method for controlling air flow in a liquid coating machine according to claim 1, wherein said adjusting means comprises a removable roof member adapted for engaging and sealing an opening in said upper compartment.

5. A method for controlling air flow in a liquid coating machine according to claim 4, wherein said removable roof member engages said opening in the upper compartment by thread means.

6. A method for controlling air flow in a liquid coating machine according to claim 4, wherein said removable roof member engages said opening by thread means such that a second distance between the specimen and a bottom end wall of said roof member can be adjusted.

7. A method for reducing contaminants from depositing on a wafer surface in a photoresist coating apparatus comprising the steps of:

providing a coating apparatus comprises an upper compartment and a lower compartment defining a cavity contained therein, said apparatus further comprises at least one adjusting means selected from the group consisting of a bracket means adapted to engage said upper compartment to said lower compartment defining a first height of said cavity and a removable roof member adapted to engage an opening in said upper compartment for defining a second height of said cavity, providing a rotatable vacuum chuck for holding a wafer thereon, providing a photoresist dispenser for dispensing a predetermined volume of photoresist on a surface of said wafer, and adjusting said first height of the cavity by said bracket means or adjusting said second height of the cavity by said removable roof means such that a desirable air flow is generated during a photoresist coating process by said rotating vacuum chuck to prevent the deposition of contaminating particles on said wafer surface.

8. A method for reducing contaminants from deposition on a wafer surface in a photoresist apparatus according to claim 7, wherein said bracket means comprises an inner peripheral bracket for mounting to an interior peripheral surface of the lower compartment onto which the upper compartment is seated, said inner peripheral bracket being mounted to said interior peripheral surface by locating pins such that its position relative to said upper compartment can be adjusted.

9. A method for reducing contaminants from deposition on a wafer surface in a photoresist apparatus according to claim 7, wherein said removable roof member engages said opening in said upper compartment by thread means such that said second height of the cavity can be adjusted by turning said removable roof member.

10. A method for reducing contaminants from deposition on a wafer surface in a photoresist apparatus according to claim 7, wherein said contaminating particles are generated by photoresist liquid bouncing off the interior wall of the upper compartment.

11. A method for reducing contaminants from deposition on a wafer surface in a photoresist apparatus according to claim 7 further comprising the step of rotating said vacuum chuck at a speed of not less than 500 RPM after said predetermined volume of photoresist is dispensed on said wafer surface.

12. A method for reducing contaminants from deposition on a wafer surface in a photoresist apparatus according to claim 7 further comprising the step of adjusting said first height of the cavity by said bracket means by not less than ½ inch.

13. A method for reducing contaminants from deposition on a wafer surface in a photoresist apparatus according to claim 7 further comprising the step of adjusting said second height of the cavity by said removable roof means by at least ¼ inch.

14. An apparatus for depositing liquid on a rotating article comprising:

a coating apparatus having an upper compartment and a lower compartment defining a cavity contained therein, a rotatable platform for rotating an article positioned on top, a liquid dispensing means suspended over said platform, and at least one adjusting means selected from the group consisting of a bracket means adapted for engaging said upper compartment to said lower compartment defining a first height of said cavity and a removable roof member adapted for engaging an opening in said upper compartment defining a second height of said cavity.

15. An apparatus for depositing liquid in a rotating article according to claim 14, wherein said apparatus is a photoresist coater for a semiconductor wafer.

16. An apparatus for depositing liquid in a rotating article according to claim 14, wherein said rotatable platform for holding an article on top is a vacuum chuck.

17. An apparatus for depositing liquid in a rotating article according to claim 14, wherein said cavity formed by said upper compartment and said lower compartment is generally of a cylindrical shape.

18. An apparatus for depositing liquid in a rotating article according to claim 14, wherein said lower compartment for said coating apparatus further comprises a spent liquid drain pipe and an exhaust pipe.

19. An apparatus for depositing liquid in a rotating article according to claim 14, wherein said bracket means comprises a toroidal shaped bracket attached to an inner peripheral surface of said lower compartment by pins.

20. An apparatus for depositing liquid in a rotating article according to claim 14, wherein said removable roof means comprises a generally circular roof member threadingly engaging said opening in the upper compartment.

* * * * *